(12) United States Patent
Wang et al.

(10) Patent No.: US 12,543,554 B2
(45) Date of Patent: Feb. 3, 2026

(54) STACKED FIELD EFFECT TRANSISTOR CONTACTS

(71) Applicant: INTERNATIONAL BUSINESS MACHINES CORPORATION, Armonk, NY (US)

(72) Inventors: Junli Wang, Slingerlands, NY (US); Albert M. Chu, Nashua, NH (US); Albert M. Young, Fishkill, NY (US); Chen Zhang, Guilderland, NY (US); Su Chen Fan, Cohoes, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 755 days.

(21) Appl. No.: 17/860,082

(22) Filed: Jul. 7, 2022

(65) Prior Publication Data
US 2024/0014135 A1 Jan. 11, 2024

(51) Int. Cl.
H01L 23/528 (2006.01)
H01L 23/48 (2006.01)
H10D 30/67 (2025.01)
H10D 84/01 (2025.01)
H10D 84/03 (2025.01)

(52) U.S. Cl.
CPC ........ H01L 23/5286 (2013.01); H01L 23/481 (2013.01); H10D 30/6757 (2025.01); H10D 84/0149 (2025.01); H10D 84/038 (2025.01)

(58) Field of Classification Search
CPC ............... H10D 84/85; H10D 84/0149; H10D 84/0186; H10D 88/00; H01L 23/481; H01L 23/535; H01L 23/5286
See application file for complete search history.

(56) References Cited

U.S. PATENT DOCUMENTS

| 7,687,331 | B2 | 3/2010 | Kim |
| 7,719,033 | B2* | 5/2010 | Jeong ..................... H10D 30/60 257/70 |
| 9,064,724 | B2 | 6/2015 | Oh |
| 9,865,736 | B2 | 1/2018 | Chang |
| 10,262,937 | B2 | 4/2019 | Lee |
| 10,886,227 | B2 | 1/2021 | Kim |

(Continued)

FOREIGN PATENT DOCUMENTS

CN 104716138 A 6/2015

Primary Examiner — Joseph C. Nicely
(74) Attorney, Agent, or Firm — David K. Mattheis

(57) ABSTRACT

A semiconductor device including a first source/drain region (S/D) located on a frontside of a substrate, wherein the first source/drain region has a first width, a second S/D region located on the frontside of the substrate, wherein the second source/drain region is located above the first source drain region, wherein the second source/drain region has second width, wherein the first width is larger than the second width, a first power rail located on a backside of the substrate, a second power rail located on the backside of the substrate, a first connector in contact with the first source/drain region, wherein the first connector is only in contact with a sidewall of the first source/drain region, and a second connector in contact with the second source/drain region, wherein the second connector is in contact with a top surface and a side surface of the second source/drain region.

20 Claims, 15 Drawing Sheets

(56) References Cited

U.S. PATENT DOCUMENTS

| | | | | |
|---|---|---|---|---|
| 2005/0179061 A1* | 8/2005 | Jang | ............... | H10D 86/40 |
| | | | | 257/E27.111 |
| 2006/0097319 A1* | 5/2006 | Kim | ............... | H01L 21/28525 |
| | | | | 257/E21.585 |
| 2006/0189126 A1* | 8/2006 | Jang | ............... | H01L 21/7684 |
| | | | | 257/E21.583 |
| 2019/0131396 A1* | 5/2019 | Zhang | ............... | B82Y 10/00 |
| 2022/0301936 A1* | 9/2022 | Merchant | ............... | H10D 62/121 |
| 2022/0310456 A1* | 9/2022 | Hall | ............... | H10D 30/6735 |
| 2023/0402379 A1* | 12/2023 | Li | ............... | H01L 21/76898 |
| 2025/0048690 A1* | 2/2025 | Chehab | ............... | H10D 88/01 |

* cited by examiner

STACKED FIELD EFFECT TRANSISTOR CONTACTS

BACKGROUND

The disclosure relates generally to stacked field effect transistors (FET). The disclosure relates particularly to source-drain (S/D) region contacts for stacked FET devices.

Semiconductor devices, such as field effect transistors, require a supportive power infrastructure to form the circuitry associated with the devices.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

In one aspect, a semiconductor device includes a first source/drain region (S/D) located on a frontside of a substrate, wherein the first source/drain region has a first width, a second S/D located on the frontside of the substrate, wherein the second source/drain region is located above the first source drain region, wherein the second source/drain region has second width, wherein the first width is larger than the second width, a first power rail located on a backside of the substrate, a second power rail located on the backside of the substrate, a first connector in contact with the first source/drain region, wherein the first connector is only in contact with a sidewall of the first source/drain region, and a second connector in contact with the second source/drain region, wherein the second connector is in contact with a top surface and a side surface of the second source/drain region.

In one aspect, semiconductor device includes a first source/drain region (S/D) located on a frontside of a substrate, a second S/D located on the frontside of the substrate, wherein the second source/drain region is located above the first source drain region, a first power rail located on a backside of the substrate, a second power rail located on the backside of the substrate, a first connector in contact with the first source/drain region, wherein the first connector comprises a first cross section and is in contact with a sidewall of the first source/drain region, and a second connector in contact with the second source/drain region, wherein the second connector comprises the first cross section and a second cross section and is in contact with a top surface and a side surface of the second source/drain region.

In one aspect, a method for fabricating a semiconductor device includes forming a first source/drain region located on a frontside of a substrate, wherein the first source/drain region has a first width, forming second source/drain region located on the frontside of the substrate, wherein the second source/drain region is located above the first source drain region, wherein the second source/drain region has a second width, wherein the first width is larger than the second width, forming a first via located extending from the front side of the substrate to beyond a lower surface of the first S/D, wherein the first via is located directly adjacent to a sidewall of the first S/D, forming a second via located extending from the front side of the substrate to beyond a lower surface of the first S/D, wherein the second via is located directly adjacent to a sidewall of the second S/D, filling a portion of each of the first via and the second via with a metal, wherein the metal in the first via extends to a top surface of the first S/D, filling the second portion of the first via and the second via with a dielectric material, forming connector trench above the second S/D, wherein the connector trench contacts the second via, removing a portion of the dielectric material located in the second via to expose the metal, and filling the connector trench and the second via with a second metal.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Figure 1A:
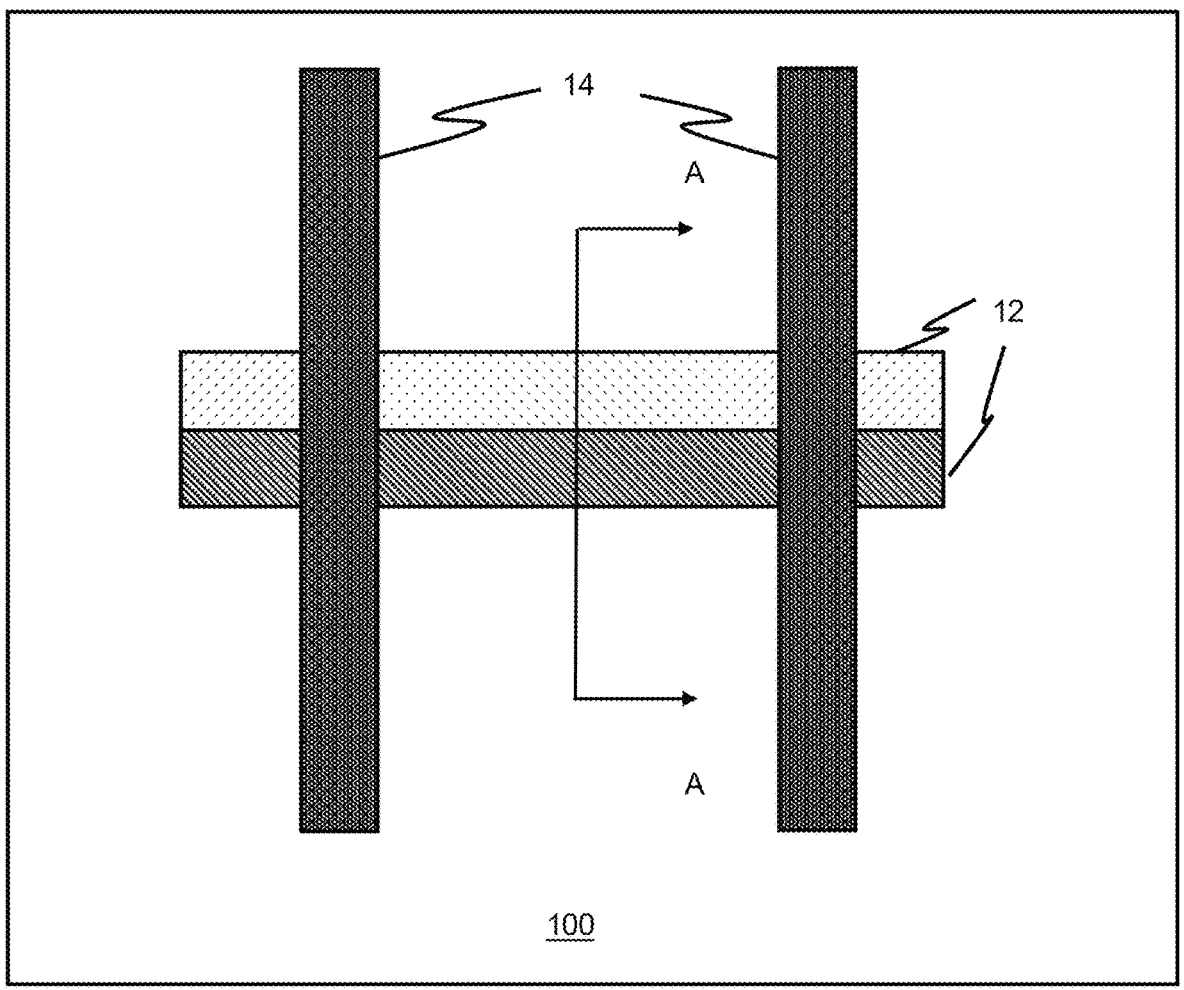
FIG. 1A provides a cross-sectional view of a step in the fabrication of a semiconductor device, according to an embodiment of the invention. The figure illustrates a plan view of the device and section line A-A associated with FIGS. 1B-13.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes SixGe1-x where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Deposition processes for the metal liner and sacrificial material include, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Semiconductor devices require electric connections to power sources to function. As devices scale to increasingly smaller dimensions, and as field effect transistor designs increasingly include stacked FET devices, connecting the devices to power supplies becomes increasingly challenging. Via to the buried power rail (VBPR) connections, formed in etched vias extending through various layers of a device present the challenge of high aspect rations of height to width with large resistances and the possibility of short circuit connections to nearby device elements. Disclosed embodiments, provide device power rail connections having reduced electrical resistance and a reduced likelihood of device short circuits while enabling device dimension downscaling. Embodiments include forming a hybrid power rail structure by firstly forming a frontside buried power rails (or power bars) in the gate cut regions and in contact with source/drain regions of lower devices, flipping the wafer and then forming upper device S/D connections to the frontside buried power rails (or power bars). In an embodiment, after forming a lower device S/D connection in contact with a side surface of the lower device S/D region, embodiment methods include forming upper device S/D connections in contact with side and upper surfaces of the upper S/D regions.

Reference is now made to the figures. The figures provide schematic cross-sectional illustration of semiconductor devices at intermediate stages of fabrication, according to one or more embodiments of the invention. FIGS. 1B-13, provide cross-sectional views indicated by section line A of FIG. 1A. The figures provide schematic representations of the devices of the invention and are not to be considered accurate or limiting with regards to device element scale.

FIG. 1A provides a plan view of a semiconductor device 100, including stacked n-type (NFET) and p-type (PFET) field effect transistors (FET). The NFET and PFET devices alternate in a pattern such as PFET-NFET, NFET-PFET, PFET . . . . The Figure illustrates section line A disposed across FET S/D regions 12 and between otherwise adjacent gate elements 14.

Figure 1B:
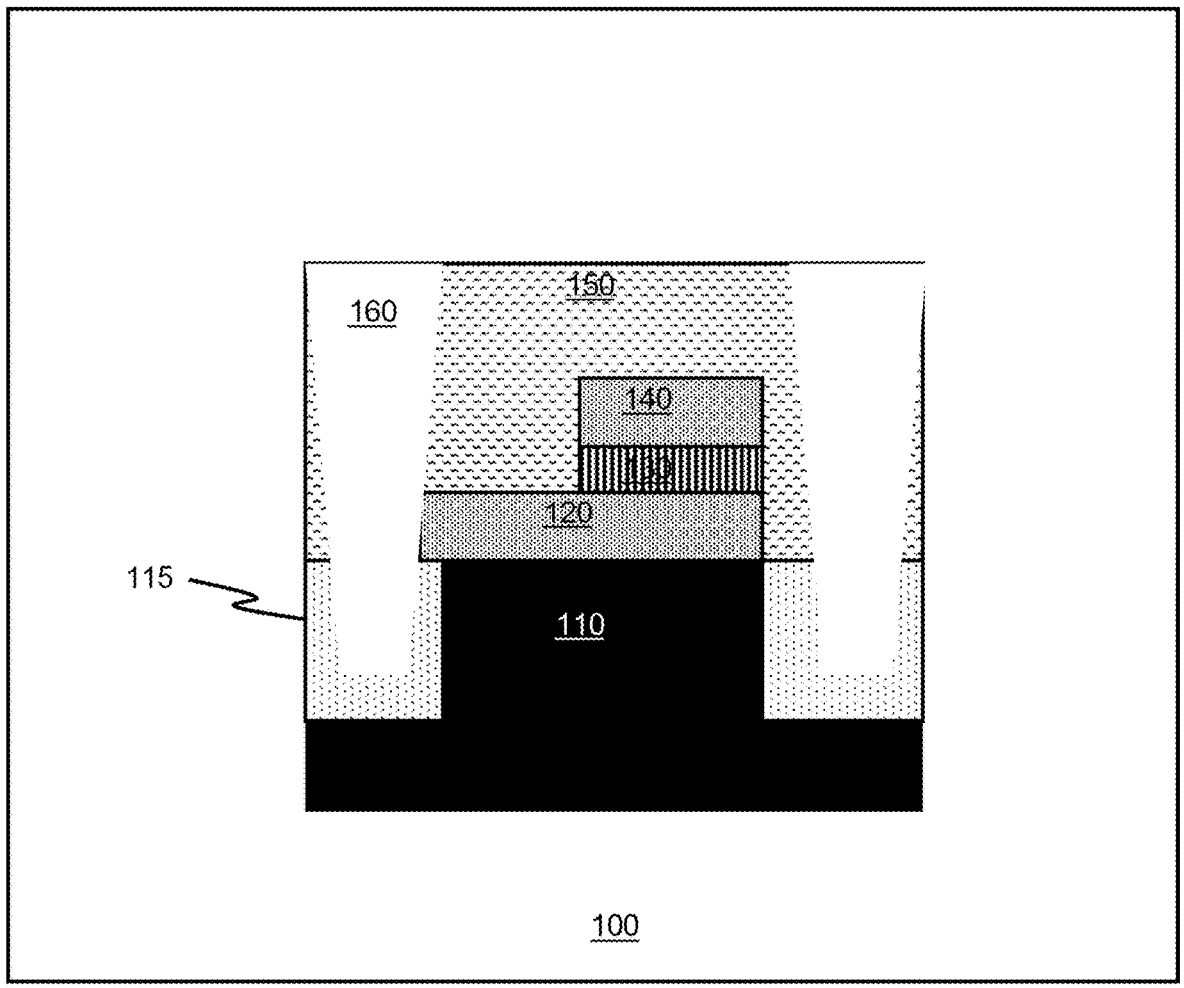
FIG. 1B provides a cross-sectional view of a step in the fabrication of a semiconductor device, according to an embodiment of the invention. The figure illustrates the device following the formation of initial source/drain region (S/D) contact cuts.

FIG. 1B illustrates device 100 after fabrication steps including the formation of a epitaxially grown lower device S/D region 120 upon an underlying substrate 110, the formation of an isolating dielectric layer 130 and the formation of epitaxially grown upper device S/D region 140 above isolating layer 130, the deposition of shallow trench isolation (STI) layer 115, such as silicon dioxide, or any suitable combination of multiple dielectric materials (e.g., silicon nitride and silicon oxide), to electrically separate otherwise adjacent fin FET devices, and the deposition and chemical-mechanical planarization (CMP) of interlayer dielectric layer 150 above and around the S/D regions 120, 140.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

In the present embodiments, the source-drain regions 120, 140, may be doped in situ by adding one or more dopant species to the epitaxial material. The dopant used will depend on the type of FET being formed, whether p-type or n-type. As used herein, "p-type" refers to the addition of impurities to an intrinsic semiconductor that creates deficiencies of valence electrons. In a silicon-containing semiconductor, examples of p-type dopants, i.e., impurities, include but are not limited to: boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to antimony, arsenic and phosphorous. In embodiments, lower S/D region 120, and upper S/D region 140, may comprise either p-type or n-type S/D regions as required by the overall device design requirements.

The semiconductor substrate 110 may include any semiconductor material including, for example, silicon. The term "semiconductor material" is used throughout the present application to denote a material that has semiconducting properties. Besides silicon, the semiconductor material may be strained Si, silicon carbide (SiC), germanium (Ge), silicon germanium (SiGe), silicon-germanium-carbon (SiGeC), Si alloys, Ge alloys, III-V semiconductor materials (e.g., gallium arsenide (GaAs), indium arsenide (InAs), indium phosphide (InP), or aluminum arsenide (AlAs)), II-VI materials (e.g., cadmium selenide (CaSe), cadmium sulfide (CaS), cadmium telluride (CaTe), zinc oxide (ZnO), zinc selenide (ZnSe), zinc sulfide (ZnS), or zinc telluride (ZnTe), or any combination thereof. By "III-V semiconductor material" it is meant that the semiconductor material includes at least one element from Group IIIA (i.e., Group 13) of the Periodic Table of Elements and at least one element from Group VA (i.e., Group 15) of the Periodic Table of Elements.

FIG. 1B illustrates the device following deposition, and planarization of interlayer dielectric (ILD) 150, above and around S/D regions 120, 140. ILD 150 comprises any suitable dielectric material, for example $Si_3N_4$, SiBCN, SiNC, SiN, SiCO, $SiO_2$, SiNOC, etc.

FIG. 1B illustrates device 100 following the deposition of a patterning hardmask (not shown) and patterning and selective etching of a set of gate cuts 160, through hardmask, ILD 150, and into STI 115. In an embodiment, gate cuts 160 have a top cut width of between about 20 nm and about 40 nm. Gate cuts 160 expose a sidewall of lower device S/D region 120.

In an embodiment, the hardmask includes a nitride, oxide, an oxide-nitride bilayer, or another suitable material such as TiN, TiOx, AlN, etc. In some embodiments, the hardmask may include an oxide such as silicon oxide (SiO), a nitride such as silicon nitride (SiN), an oxynitride such as silicon oxynitride (SiON), combinations thereof, etc. In some embodiments, the hardmask is a silicon nitride such as $Si_3N_4$.

Figure 2:
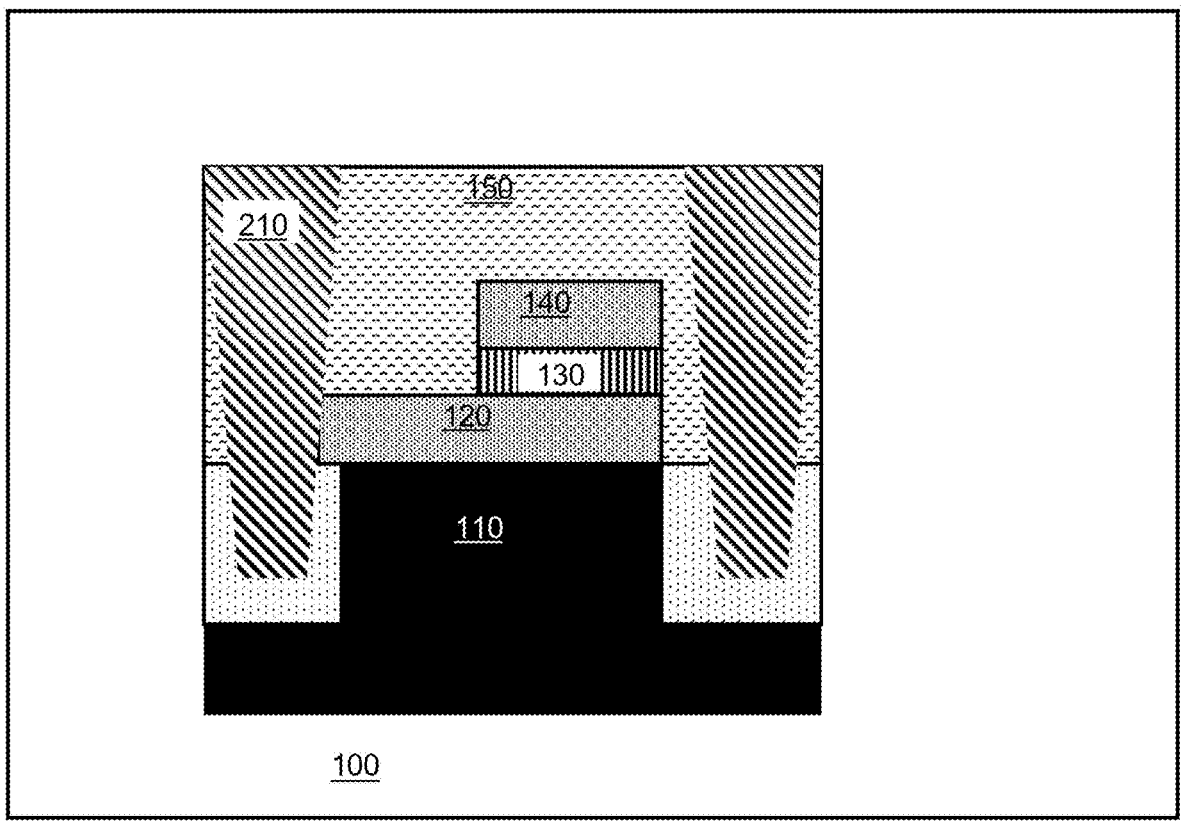
FIG. 2 provides a cross-sectional view of a step in the fabrication of a semiconductor device, according to an embodiment of the invention. The figure illustrates the device following metallization of the initial S/D contacts.

FIG. 2 illustrates device 100 following deposition of frontside buried metal rails 210 in wide gate cuts 160. In an embodiment, buried metal rails 210 comprises a material such as W, Ru, or Co, with an adhesion metal liner such as TiN. In an embodiment, metal rails 210 contact the side surface of lower device S/D region 120.

Figure 3:
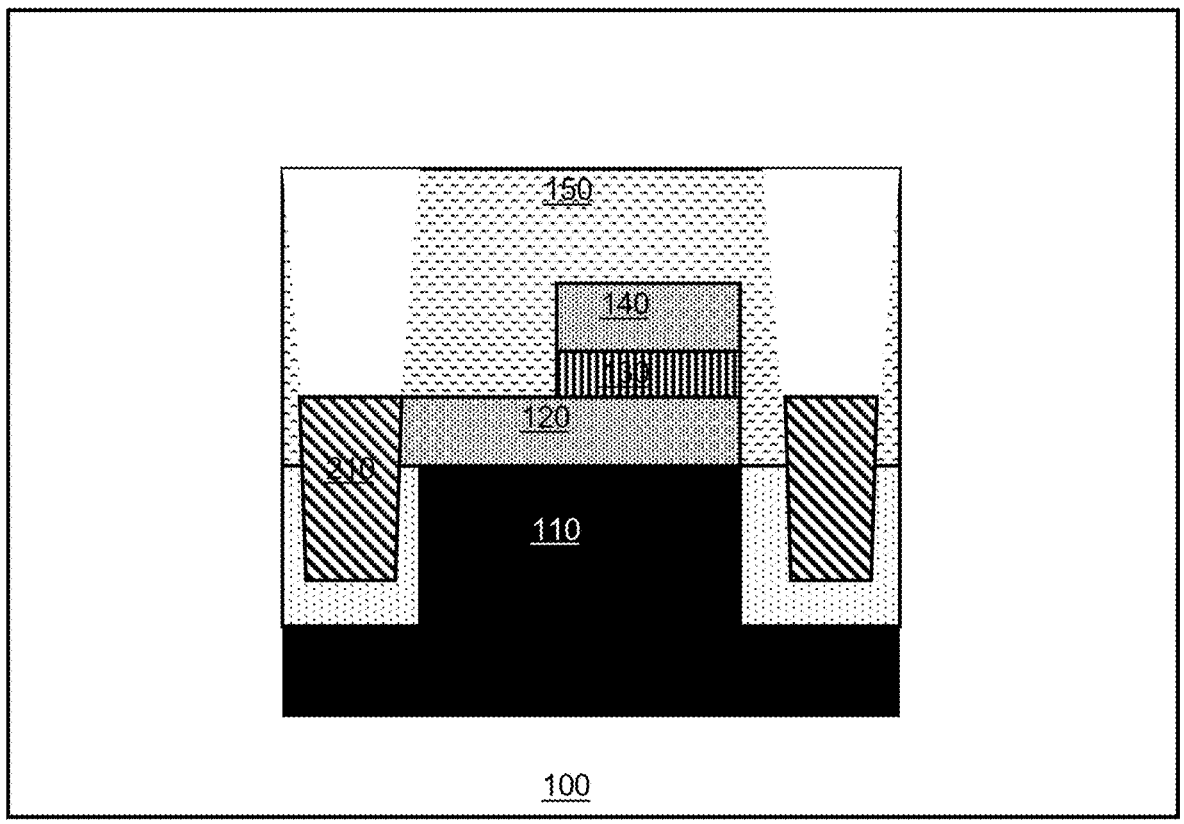
FIG. 3 provides a cross-sectional view of a step in the fabrication of a semiconductor device, according to an embodiment of the invention. The figure illustrates the device after recessing the initial S/D contacts.
Figure 4:
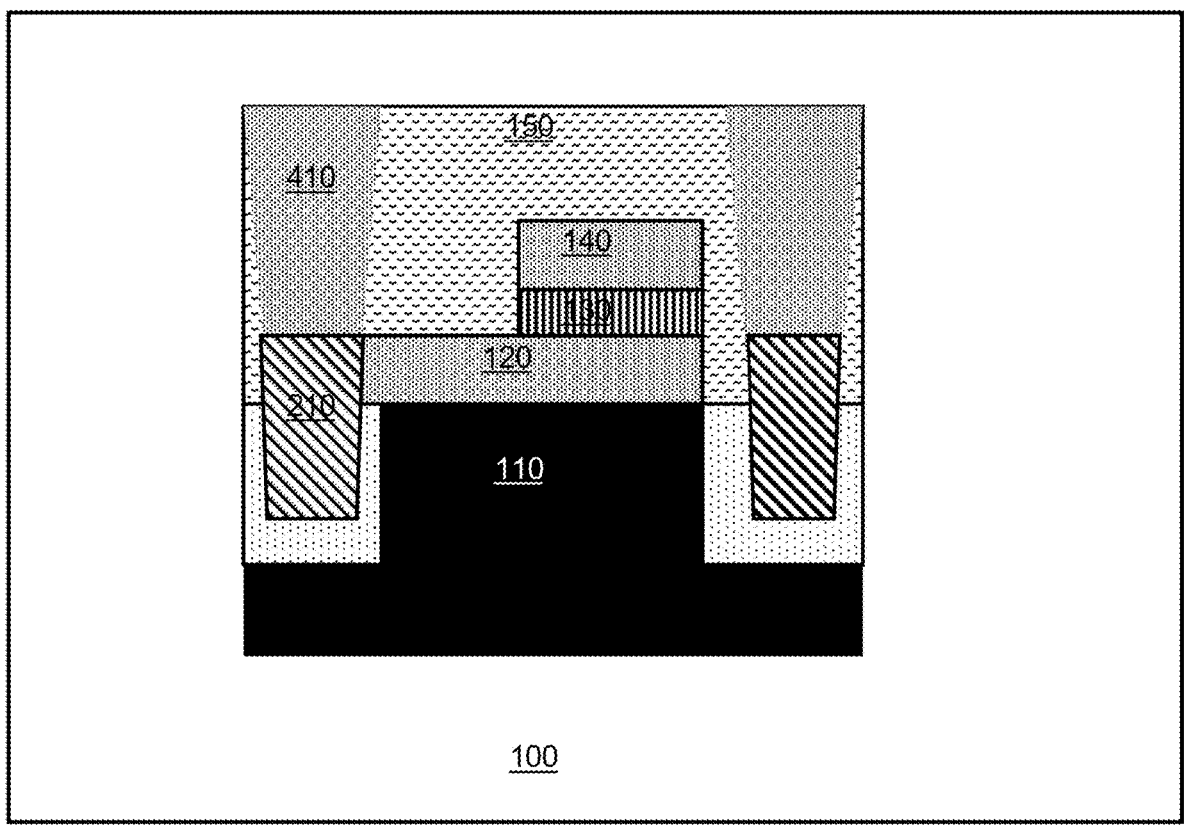
FIG. 4 provides a cross-sectional view, of a step in the fabrication of a semiconductor device, according to an embodiment of the invention. The figure illustrates the device after filling the S/D contact cuts with a dielectric material.

FIG. 3 illustrates device 100 following the recessing frontside buried metal rails 210 to the upper surface height of lower device S/D region 120 through selective etching. Recessing metal rails 210 yields final rails extending above STI materials 115 and having some overlap lower device S/D region 120. FIG. 4 illustrates device 100 following deposition and CMP of addition dielectric materials 410, differing from ILD 150 and isolating layer 130 materials, filling the remaining spaces of gate cuts 160, above metal rails 210.

Figure 5:
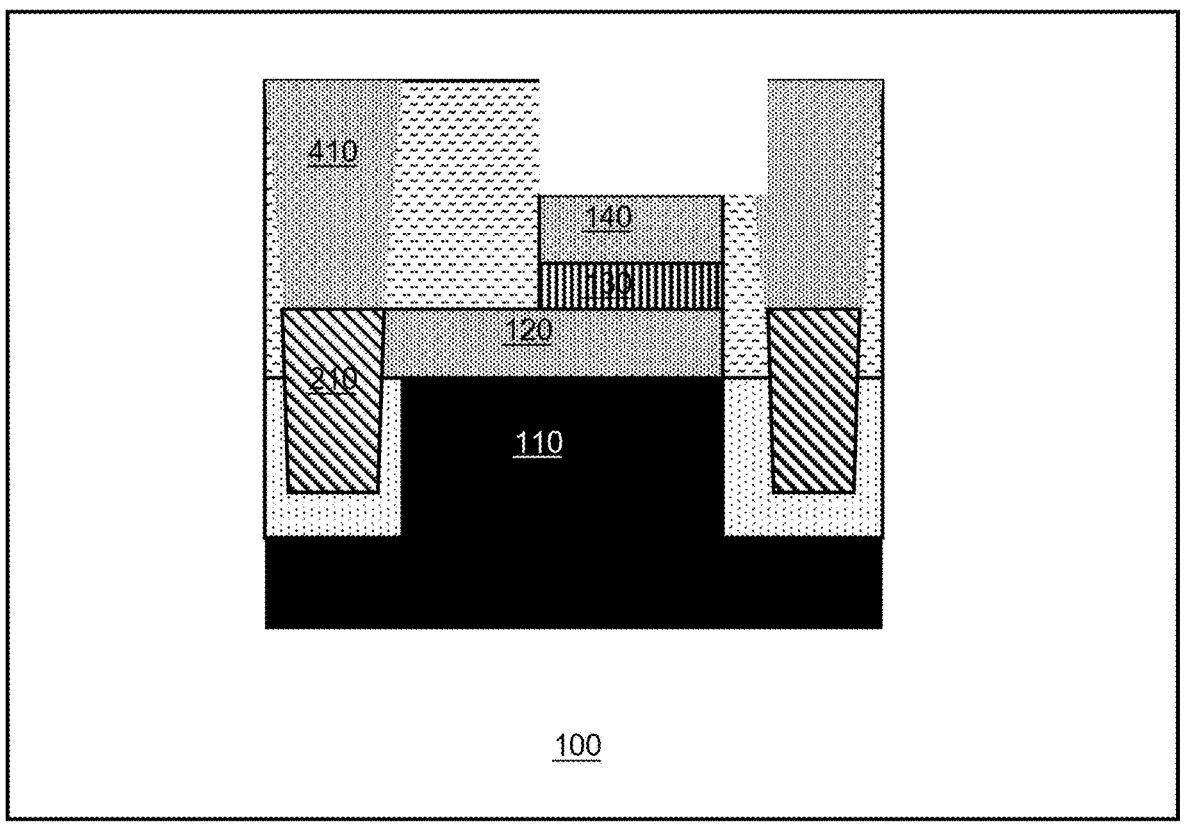
FIG. 5 provides a cross-sectional view of a step in the fabrication of a semiconductor device, according to an embodiment of the invention. The figure illustrates the device after a first patterning and selective etching associated with the upper S/D region contact.
Figure 6:
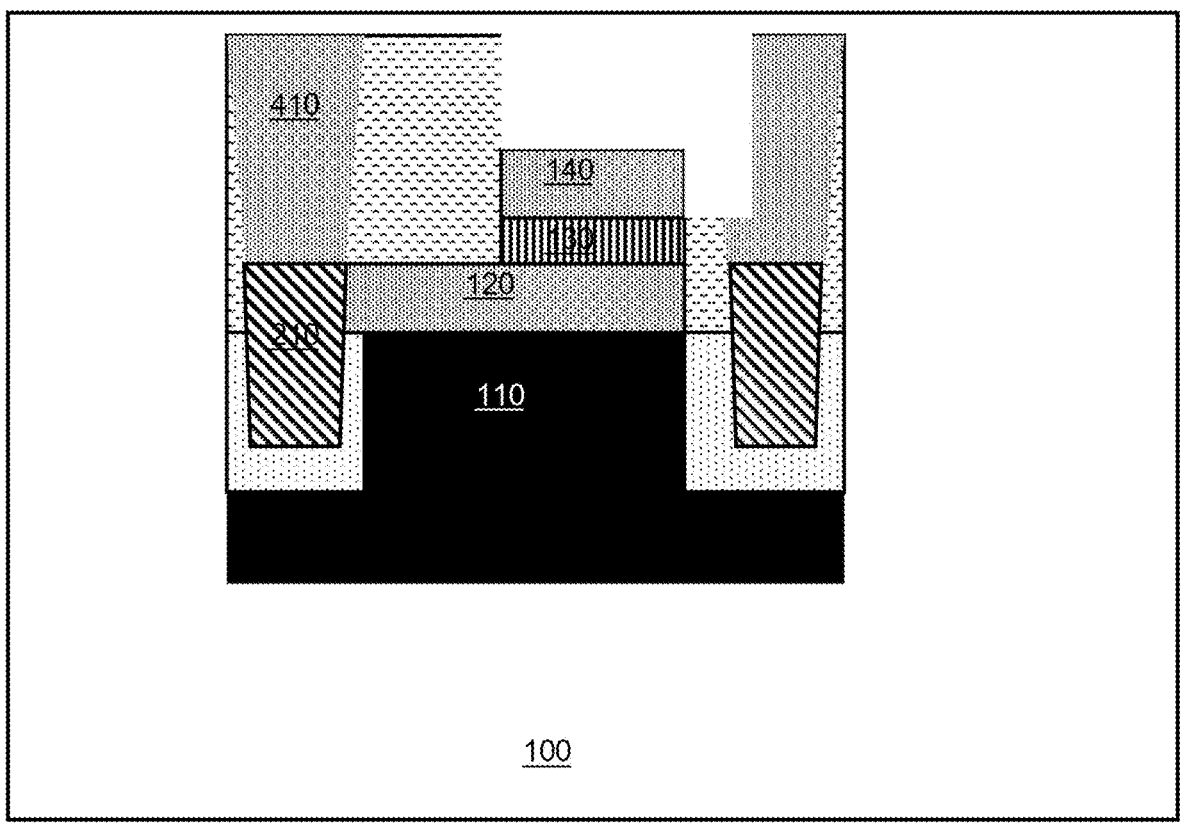
FIG. 6 provides a cross-sectional view of a step in the fabrication of a semiconductor device, according to an embodiment of the invention. The figure illustrates the device after a second patterning and selective etching associated with the upper S/D region contact.
Figure 7:
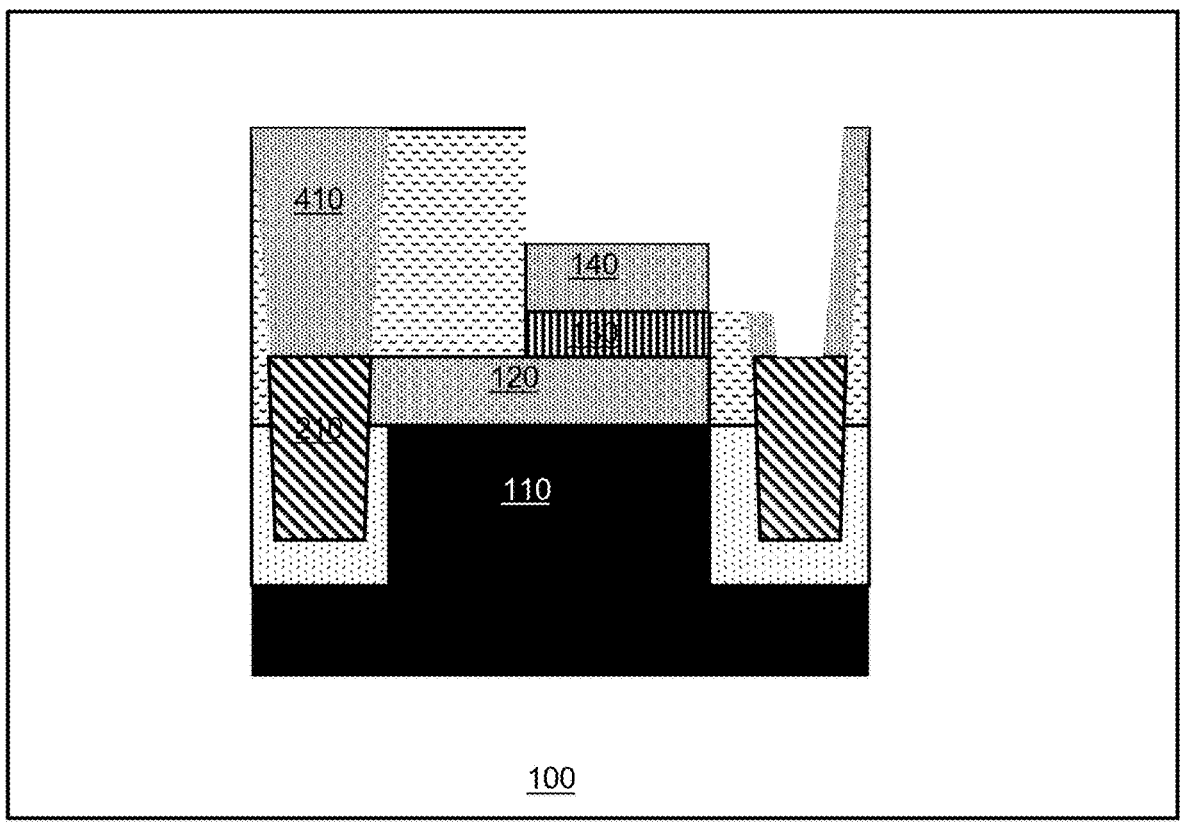
FIG. 7 provides a cross-sectional view of a step in the fabrication of a semiconductor device, according to an embodiment of the invention. The figure illustrates the device after a third patterning and selective etching associated with the upper S/D region contact.

FIGS. 5-7 illustrates device 100 following successive patterning and etching sequences. As shown in FIG. 5, portions of ILD 150 and dielectric 410, exposing a portion of the upper surface of upper device S/D region 140. FIG. 6 illustrates device 100 following additional patterning and etching to expose a sidewall of upper device S/D region 140. FIG. 7 illustrates device 100 following a third patterning in an etching sequence to remove additional dielectric 410, thereby exposing a portion of metal rails 210.

Figure 8:
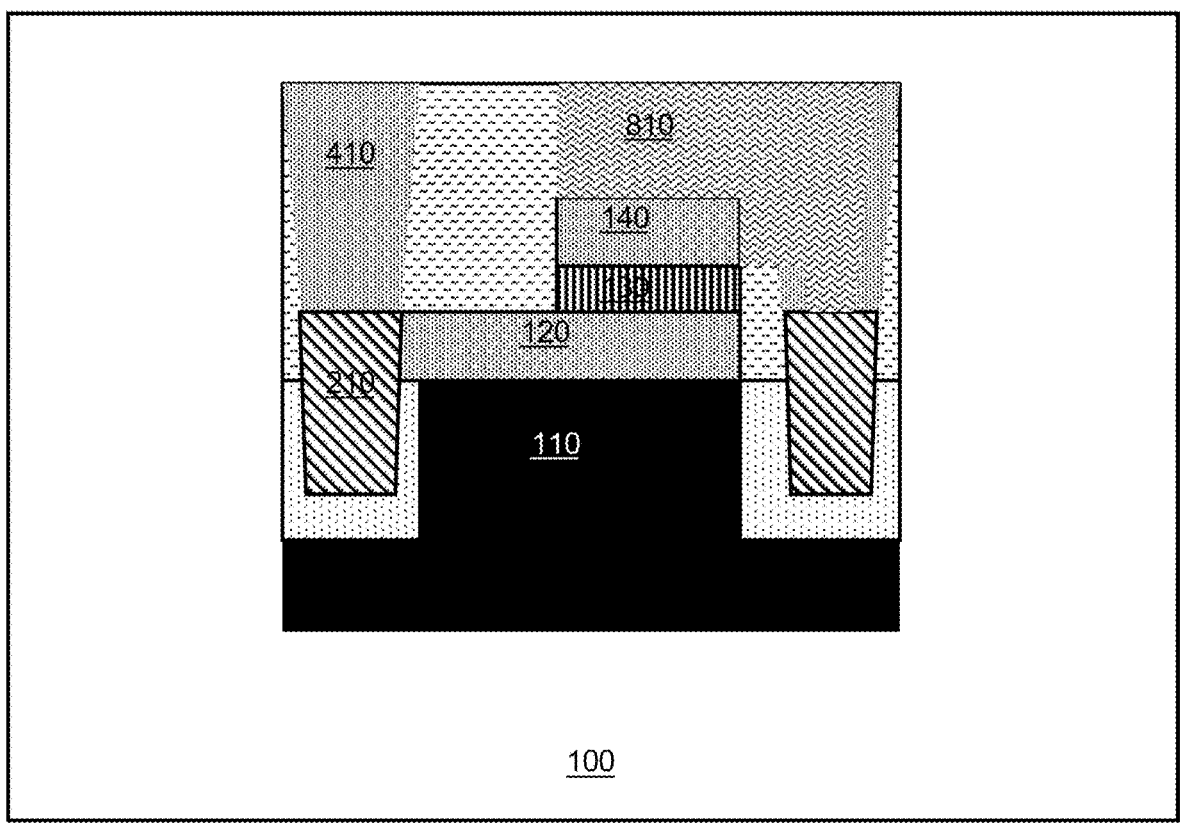
FIG. 8 provides a cross-sectional view of a step in the fabrication of a semiconductor device, according to an embodiment of the invention. The figure illustrates the device after metallization of the upper S/D region contact.

FIG. 8 illustrates device 100 following formation a contact 810, for of upper S/D region 140. Contact 810 electrically connects side and upper surfaces of upper S/D region 140 with metal rail 210. In an exemplary embodiment, formation of a trench metallized contact layer 810, includes forming a silicide layer between contact and epitaxial grown S/D regions 140, (e.g., Ni silicide, Ti silicide, NiPt silicide, Co silicide, etc.) followed by forming metallization materials above the silicide (e.g., a thin adhesion metal such as TiN and a bulk metal fill such as Co, W, Ru, etc., followed by CMP.

Figure 9:
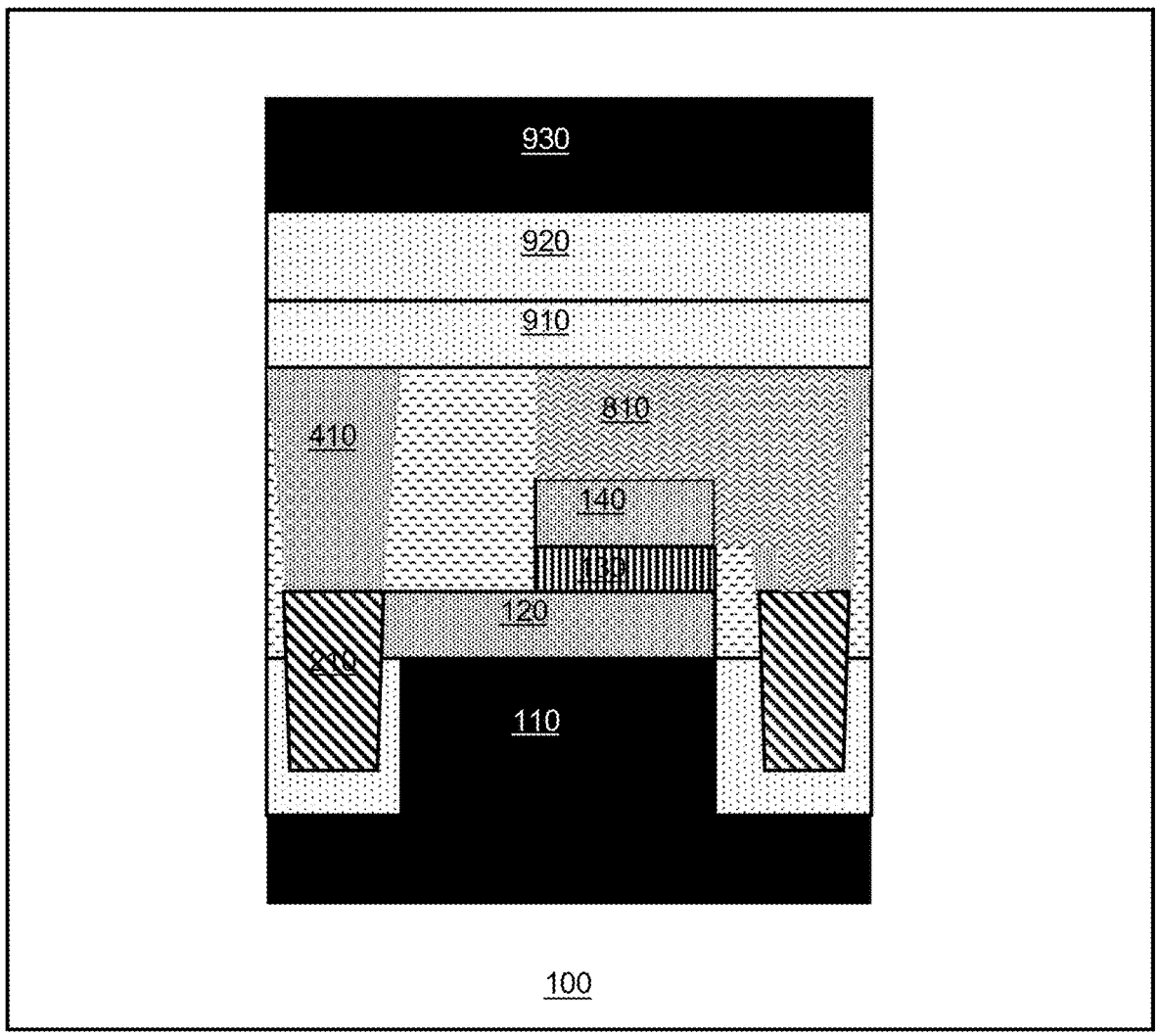
FIG. 9 provides a cross-sectional view of a step in the fabrication of a semiconductor device, according to an embodiment of the invention. The figure illustrates the device after completion of back-end-of-line fabrication steps.

FIG. 9 illustrates device 100 following deposition of additional ILD materials 910. formation of a generalized back-end-of-line (BEOL) interconnect structure 920, and a carrier wafer substrate structure 930 bonded to the BEOL structure 920.

Figure 10:
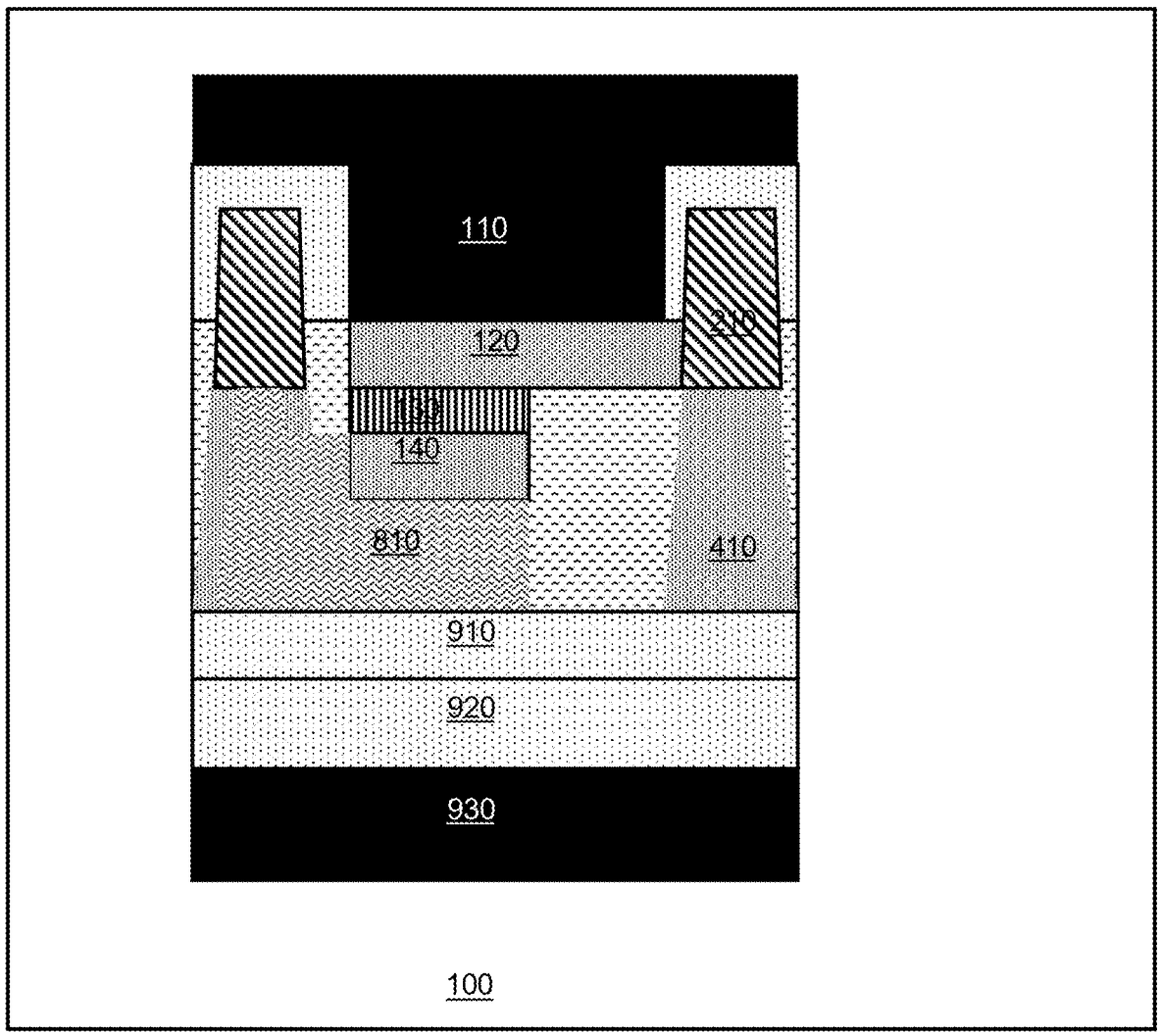
FIG. 10 provides a cross-sectional view of a step in the fabrication of a semiconductor device, according to an embodiment of the invention. The figure illustrates the device after inverting the partially fabricated structure.
Figure 11:
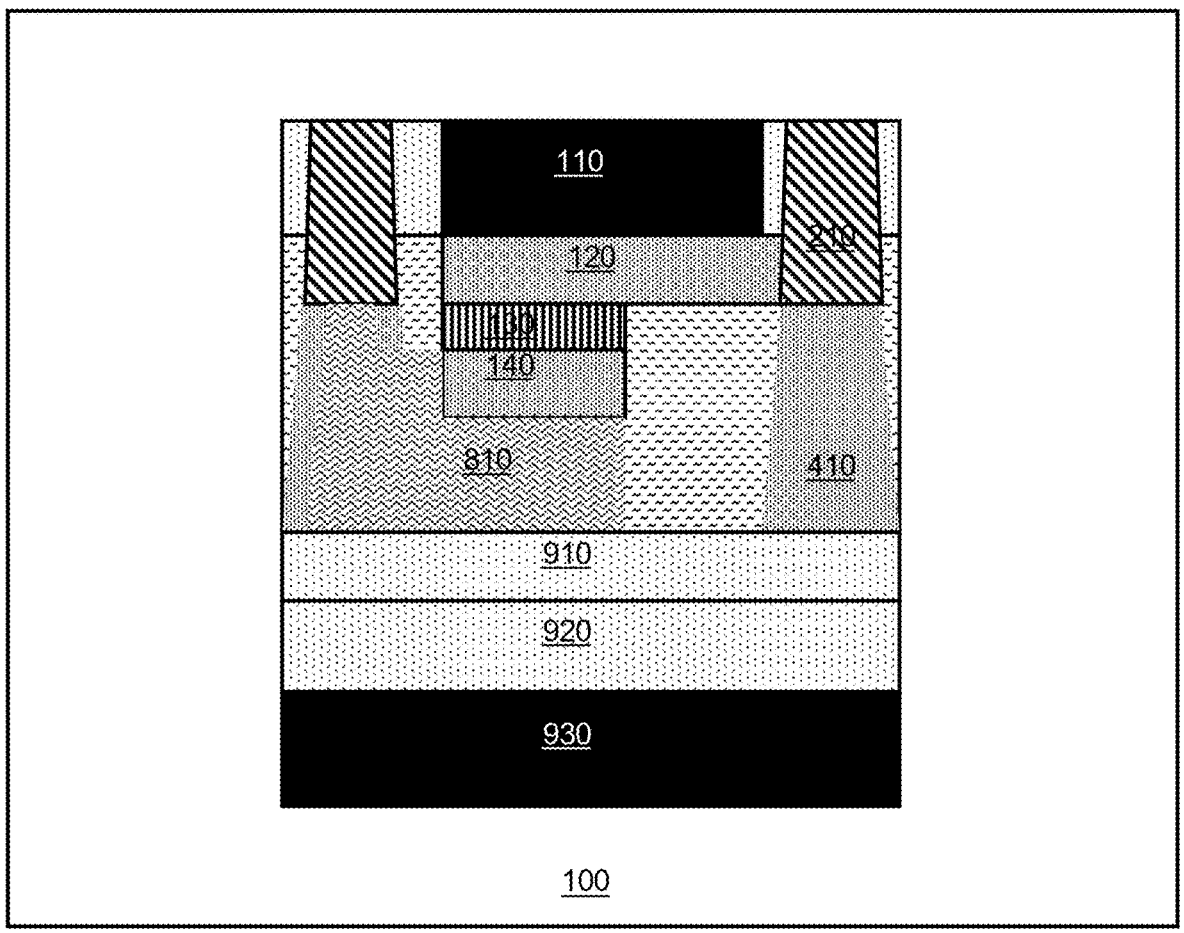
FIG. 11 provides a cross-sectional view of a step in the fabrication of a semiconductor device, according to an embodiment of the invention. The figure illustrates the device after removal of backside materials, exposing metallized S/D region contacts.
Figure 12:
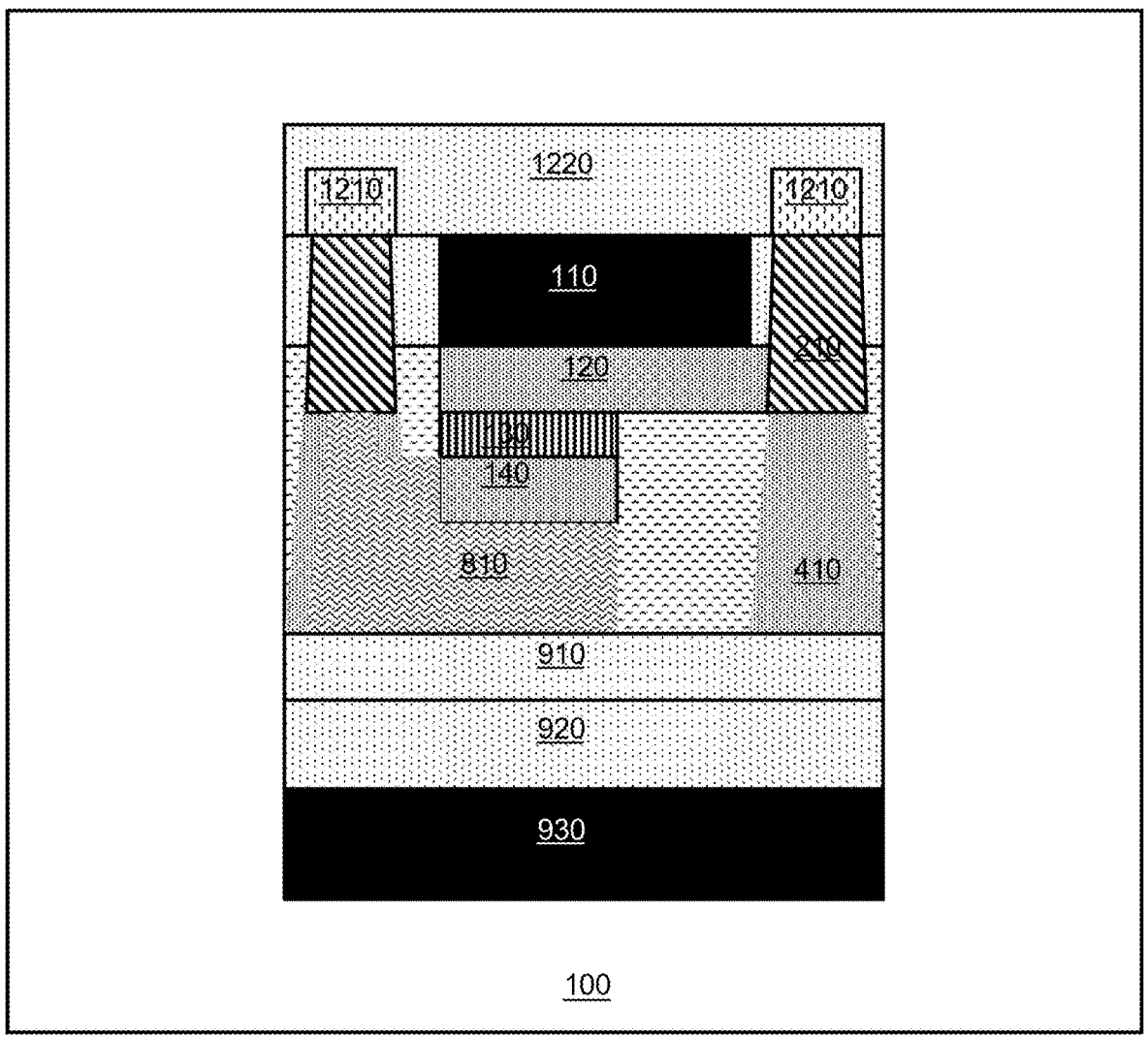
FIG. 12 provides a cross-sectional view of a step in the fabrication of a semiconductor device, according to an embodiment of the invention. The figure illustrates the device after fabrication of backside power bars.
Figure 13:
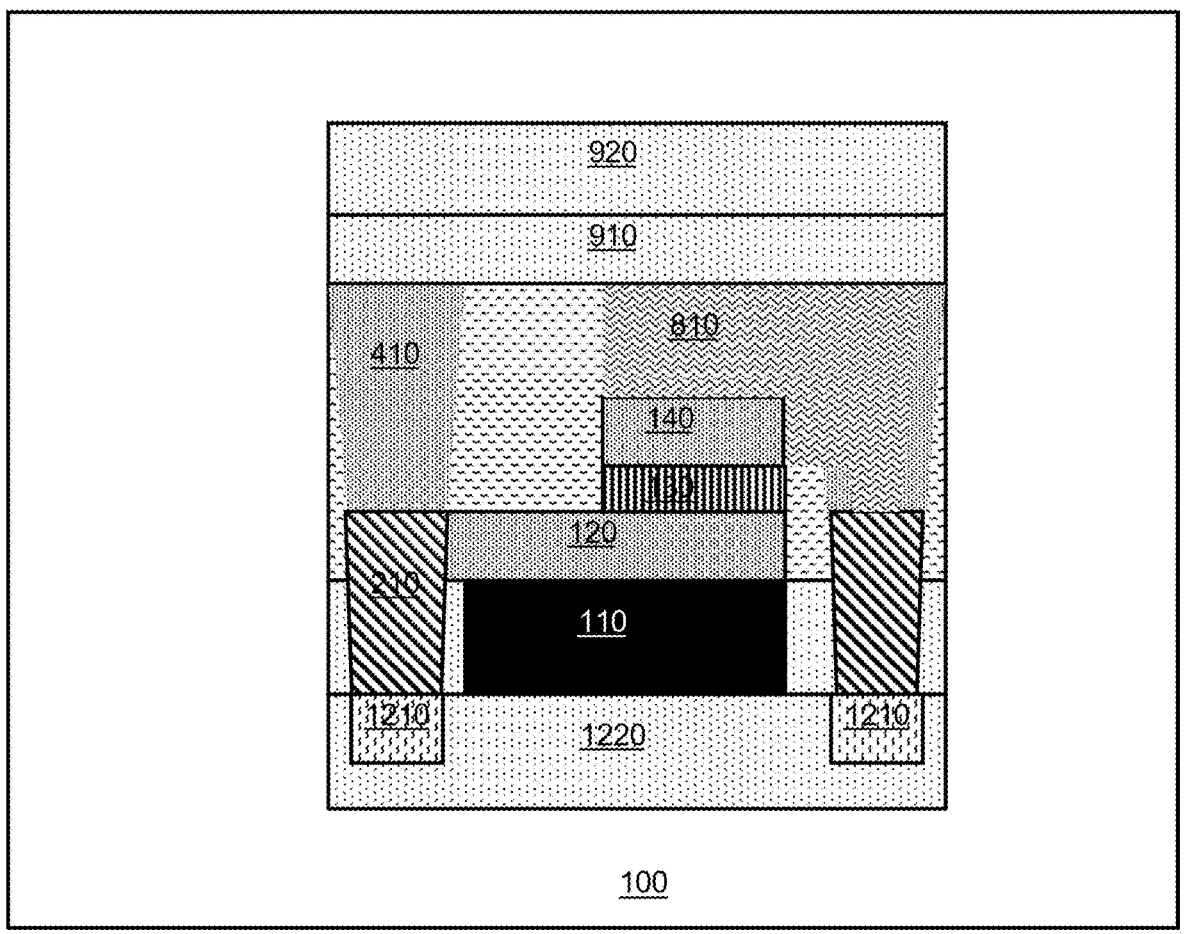
FIG. 13 provides a cross-sectional view of a step in the fabrication of a semiconductor device, according to an embodiment of the invention. The figure illustrates the device after a second inversion of the partially fabricated structure and removal of the handling wafer structure.

FIG. 10 illustrates device 100 following a flipping of the partially fabricated structure, exposing underlying substrate 110. FIG. 11 illustrates device 100 following selective etching to remove portions of substrate 110 and STI 115, thereby exposing metal rails 210. FIG. 12 illustrates device 100 following formation of backside power bars 1210 and deposition and CMP of ILD material 1220 above and around power rails 1210. FIG. 13 illustrates device 100 following a second flipping of the device and selective etching to remove carrier wafer 930.

Figure 14:
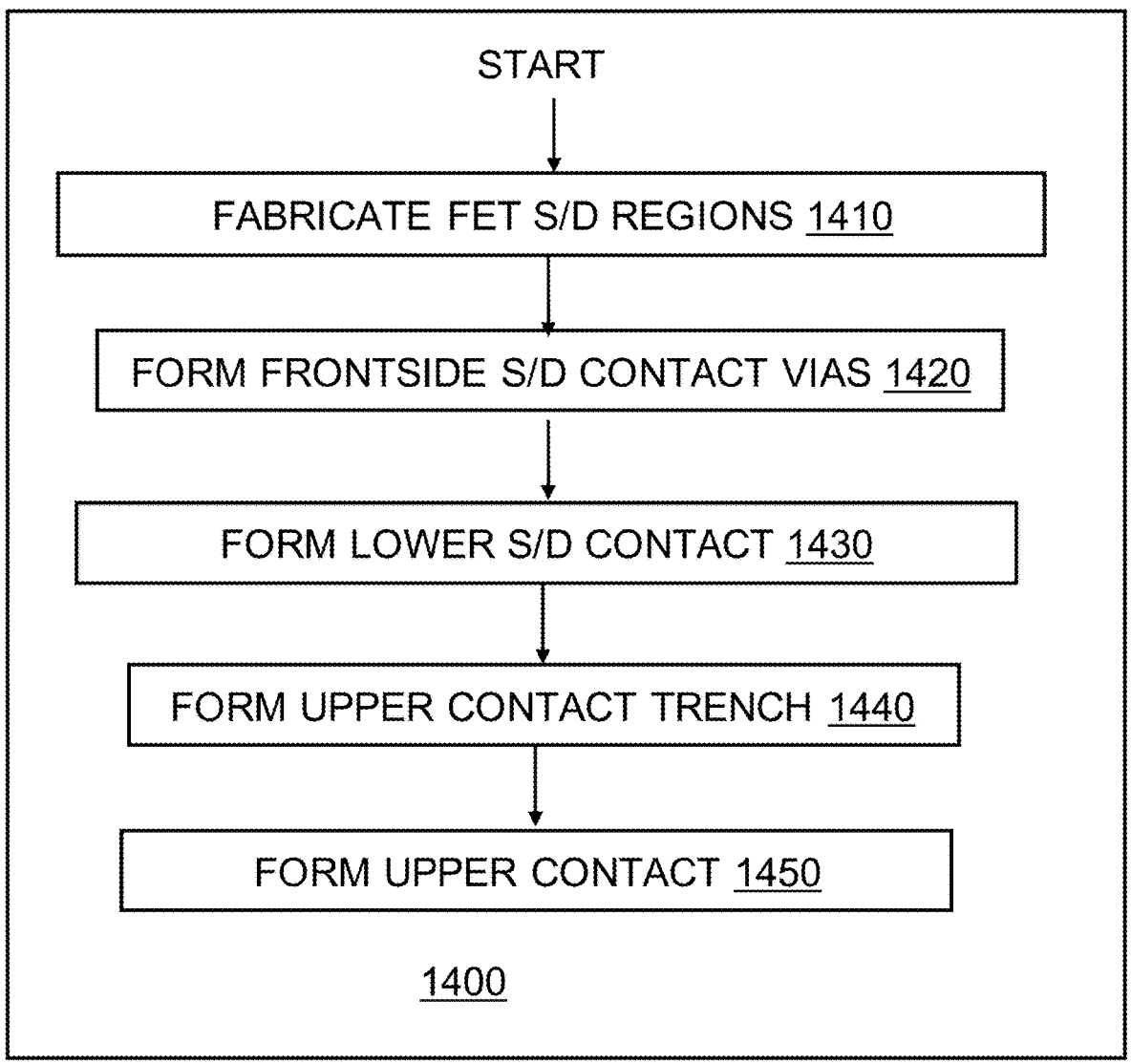
FIG. 14 provides a flowchart depicting operational steps for forming semiconductor device, according to an embodiment of the invention.

FIG. 14 illustrates fabrication steps associated with a semiconductor device according to an embodiment of the invention. At block 1410, front-end-of-line processes yield a partially fabricated device including a lower device source/drain region having a first width, an upper device source/drain region having a second width, wherein the first width is larger than the second width. The upper device source/drain region disposed above the lower device source/drain region.

At block 1420, formation of source/drain contact vias yields a first via exposing a portion of a sidewall of the lower device S/D region, and a second via disposed adjacent to the upper device S/D region.

At block 1430, the method fills and then partially recesses the contact vias yielding metal contact rails at least to the level of the lower device S/D region. The method fills any remaining portion of the contact vias with a dielectric material and planarizes the dielectric material.

At block 1440, the method forms a connector trench exposing the contact metal o the second via as well as a side surface of the upper device S/D region and a portion of the upper surface of the upper device S/D region.

At block 1450 the method completes the upper device S/D region contact by filling the connector trench with a contact material.

Further process steps yield backside power bars in contact with the metal rails for each of the upper and lower device S/D regions, as well as additional BEOL processes for power distribution and additional device connections.

The flowchart and block diagrams in the figures illustrate the architecture, functionality, and operation of possible implementations of systems, methods, and device fabrication steps according to various embodiments of the present invention. In this regard, each block in the flowchart or block diagrams may represent a module, segment, or portion of instructions, which comprises one or more fabrication steps for manufacturing the specified device(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:
  a first source/drain region (S/D) located on a frontside of a substrate, wherein the first source/drain region has a first width;
  a second S/D located on the frontside of the substrate, wherein the second source/drain region is located above the first source/drain region, wherein the second source/drain region has a second width, wherein the first width is larger than the second width;
  a first power rail located on a backside of the substrate;
  a second power rail located on the backside of the substrate;
  a first connector in contact with the first source/drain region, wherein the first connector is only in contact with a sidewall of the first source/drain region; and
  a second connector in contact with the second source/drain region, wherein the second connector is in contact with a top surface and a side surface of the second source/drain region.

2. The semiconductor device according to claim 1, wherein the first backside power rail is in contact with the first connector.

3. The semiconductor device according to claim 1, wherein the second backside power rail is in contact with the second connector.

4. The semiconductor device according to claim 1, wherein the first S/D comprises an n-type S/D, and the second S/D comprises a p-type S/D.

5. The semiconductor device according to claim 1, wherein the first S/D comprises a p-type S/D, and the second S/D comprises an n-type S/D.

6. The semiconductor device according to claim 1, wherein the first S/D comprises a p-type S/D.

7. The semiconductor device according to claim 1, wherein the second S/D comprises an n-type S/D.

8. A semiconductor device comprising:
  a first source/drain region (S/D) located on a frontside of a substrate wherein the first source/drain region has a first width;
  a second S/D located on the frontside of the substrate, wherein the second source/drain region is located above the first source/drain region wherein the second source/drain region has a second width, wherein the first width is larger than the second width;
  a first power rail located on a backside of the substrate;
  a second power rail located on the backside of the substrate;
  a first connector in contact with the first source/drain region, wherein the first connector comprises a first cross section and is in contact with a sidewall of the first source/drain region; and
  a second connector in contact with the second source/drain region, wherein the second connector comprises the first cross section and a second cross section and is in contact with a top surface and a side surface of the second source/drain region.

9. The semiconductor device according to claim 8, wherein the first backside power rail is in contact with the first connector.

10. The semiconductor device according to claim 8, wherein the first S/D comprises an n-type S/D, and the second S/D comprises a p-type S/D.

11. The semiconductor device according to claim 8, wherein the first S/D comprises a p-type S/D, and the second S/D comprises an n-type S/D.

12. The semiconductor device according to claim 8, wherein the first S/D comprises a p-type S/D.

13. The semiconductor device according to claim 8, wherein the second S/D comprises an n-type S/D.

14. A method comprising
  forming a first source/drain region located on a frontside of a substrate, wherein the first source/drain region has a first width;
  forming a second source/drain region located on the frontside of the substrate, wherein the second source/drain region is located above the first source/drain region, wherein the second source/drain region has a second width, wherein the first width is larger than the second width;
  forming a first via located extending from the frontside of the substrate to beyond a lower surface of the first S/D, wherein the first via exposes a sidewall of the first S/D;
  forming a second via located extending from the frontside of the substrate to beyond a lower surface of the first S/D, wherein the second via is located directly adjacent to a sidewall of the second S/D;
  filling a portion of each of the first via and the second via with a metal, wherein the metal in the first via extends to a top surface of the first S/D;
  filling the second portion of the first via and the second via with a dielectric material;
  forming connector trench above the second S/D, wherein the connector trench contacts the second via;
  removing a portion of the dielectric material located in the second via to expose the metal; and
  filling the connector trench and the second via with a second metal.

15. The method of fabricating a semiconductor device according to claim 14, further comprising forming a first backside power rail in contact with the metal of the first via.

16. The method of fabricating a semiconductor device according to claim 14, further comprising forming a second backside power rail in contact with the metal of the second via.

17. The method of fabricating a semiconductor device according to claim 14, wherein the first S/D comprises an n-type S/D, and the second S/D comprises a p-type S/D.

18. The method of fabricating a semiconductor device according to claim 14, wherein the first S/D comprises a p-type S/D, and the second S/D comprises an n-type S/D.

19. The method of fabricating a semiconductor device according to claim 14, wherein the first S/D comprises a p-type S/D.

20. The method of fabricating a semiconductor device according to claim 14, wherein the second S/D comprises an n-type S/D.

* * * * *